United States Patent
Kim et al.

(10) Patent No.: US 12,261,626 B2
(45) Date of Patent: Mar. 25, 2025

(54) CODING CIRCUIT AND MEMORY DEVICE INCLUDING THE SAME

(71) Applicants: SK hynix Inc., Icheon (KR); KOREA UNIVERSITY RESEARCH AND BUSINESS FOUNDATION, Seoul (KR)

(72) Inventors: Minseo Kim, Seoul (KR); Jongsun Park, Seoul (KR); Jinho Jeong, Icheon (KR)

(73) Assignees: SK hynix Inc., Icheon (KR); KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 18/357,763

(22) Filed: Jul. 24, 2023

(65) Prior Publication Data
US 2024/0305312 A1    Sep. 12, 2024

(30) Foreign Application Priority Data
Mar. 6, 2023 (KR) .................. 10-2023-0029220

(51) Int. Cl.
*H03M 13/11* (2006.01)
*H03M 13/15* (2006.01)

(52) U.S. Cl.
CPC ..... *H03M 13/1177* (2013.01); *H03M 13/152* (2013.01); *H03M 13/158* (2013.01)

(58) Field of Classification Search
CPC ........... H03M 13/1177; H03M 13/152; H03M 13/158

USPC .................................. 714/752, 758
See application file for complete search history.

(56) References Cited

U.S. PATENT DOCUMENTS

| | | | | |
|---|---|---|---|---|
| 3,949,208 A * | 4/1976 | Carter | ................ | G06F 11/1024 714/E11.056 |
| 5,459,740 A * | 10/1995 | Glaise | ................ | H03M 13/151 714/755 |
| 6,604,222 B1 * | 8/2003 | Jensen | ................ | H03M 13/17 714/785 |
| 10,673,464 B1 * | 6/2020 | Rahul | ................ | G06F 11/1076 |
| 10,908,995 B2 * | 2/2021 | Saxena | ................ | H03M 13/19 |
| 10,944,429 B1 * | 3/2021 | Yang | ................ | H03M 13/13 |
| 2005/0188292 A1 * | 8/2005 | Chen | ................ | G11C 29/42 714/768 |
| 2013/0262957 A1 * | 10/2013 | Wu | ................ | H03M 13/152 714/763 |
| 2014/0068391 A1 * | 3/2014 | Goel | ................ | H03M 13/2942 714/785 |
| 2020/0104205 A1 * | 4/2020 | Noguchi | ................ | G06F 11/102 |
| 2021/0019225 A1 * | 1/2021 | Oh | ................ | G06F 11/1048 |
| 2021/0036719 A1 * | 2/2021 | Kim | ................ | H03M 13/3715 |

(Continued)

*Primary Examiner* — Esaw T Abraham
*Assistant Examiner* — Osman M Alshack (57) ABSTRACT

A coding circuit includes an encoder circuit configured to generate an input codeword by concatenating an input data and a parity generated by processing the input data using an odd parity generator matrix; and a decoder circuit configured to correct a double error from an output codeword, and to detect a triple error using a syndrome generated by processing the output codeword using the odd parity generator matrix, wherein each column of the odd parity generator matrix has a respective odd number of 1's.

12 Claims, 7 Drawing Sheets

(56) References Cited

U.S. PATENT DOCUMENTS

2023/0129113 A1* 4/2023 Dai .................... G06F 21/6218
                                                    726/27
2023/0168819 A1* 6/2023 Song ................... G06F 11/1068

* cited by examiner

FIG. 1

| m | #1 DEC (CODEWORD, DATA, PARITY) | #2 DEC/TED (CODEWORD, DATA, PARITY) |
|---|---|---|
| 5 | (31, 21, 10) | (32, 21, 11) |
| 6 | (63, 51, 12) | (64, 51, 13) |
| 7 | (127, 113, 14) | (128, 113, 15) |
| 8 | (255, 239, 16) | (256, 239, 17) |
| 9 | (511, 493, 18) | (512, 493, 19) |
| 10 | (1023, 1003, 20) | (1024, 1003, 21) |
| 11 | (2047, 2025, 22) | (2048, 2025, 23) |
| 12 | (4095, 4071, 24) | (4096, 4071, 25) |
| 13 | (8191, 8165, 26) | (8192, 8165, 27) |
| 14 | (16383, 16355, 28) | (16384, 16355, 29) |
| 15 | (32767, 32737, 30) | (32768, 32737, 31) |

<PRIOR ART>

| m | #1 DEC (CODEWORD, DATA, PARITY) | #2 DEC/TED (CODEWORD, DATA, PARITY) | DEC/TED (SHORTENED CODEWORD, DATA, PARITY) |
|---|---|---|---|
| 5 | (31, 21, 10) | (32, 21, 11) | (20, 10, 10) |
| 6 | (63, 51, 12) | (64, 51, 13) | (40, 28, 12) |
| 7 | (127, 113, 14) | (128, 113, 15) | (72, 58, 14) |
| 8 | (255, 239, 16) | (256, 239, 17) | (144, 128, 16) |
| 9 | (511, 493, 18) | (512, 493, 19) | (272, 254, 18) |
| 10 | (1023, 1003, 20) | (1024, 1003, 21) | (544, 524, 20) |
| 11 | (2047, 2025, 22) | (2048, 2025, 23) | (1056, 1034, 22) |
| 12 | (4095, 4071, 24) | (4096, 4071, 25) | (2112, 2088, 24) |
| 13 | (8191, 8165, 26) | (8192, 8165, 27) | (4160, 4134, 26) |
| 14 | (16383, 16355, 28) | (16384, 16355, 29) | (8320, 8292, 28) |
| 15 | (32767, 32737, 30) | (32768, 32737, 31) | (16512, 16482, 30) |

<PRIOR ART>  <Present Embodiment>

CODING CIRCUIT AND MEMORY DEVICE INCLUDING THE SAME

CROSS-REFERENCE TO RELATED APPLICATION

The present application claims priority under 35 U.S.C. § 119 (a) to Korean Patent Application No. 10-2023-0029220, filed on Mar. 6, 2023, which is incorporated herein by reference in its entirety.

BACKGROUND

1. Technical Field

Various embodiments generally relate to a coding device and a memory device including the coding device.

2. Related Art

Figure 1:
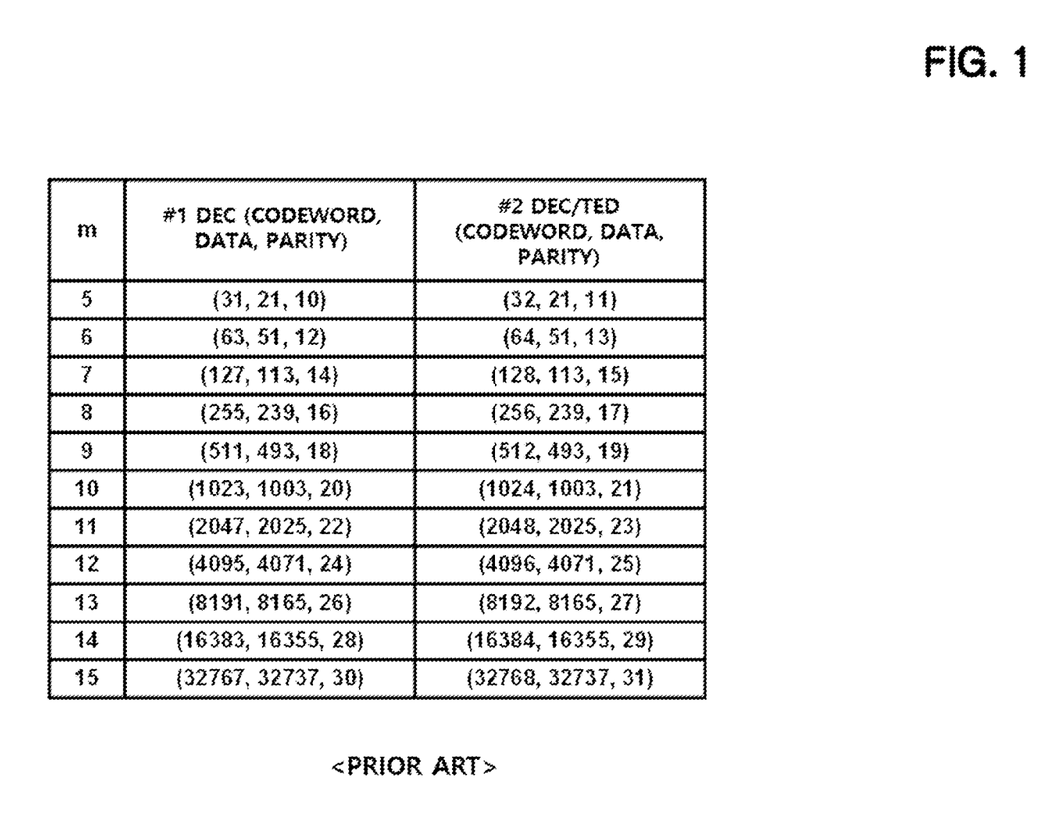
FIG. 1 is a table showing lengths of codewords generated according to the conventional art.

FIG. 1 is a table showing a length of codewords generated by a coding circuit according to the prior art.

In FIG. 1, the prior art #1 is based on a conventional Bose-Chaudhuri-Hocquenghem (BCH) coding circuit performing double error correction (DEC) on a finite field GF ($2^m$), and the prior art #2 is based on a conventional BCH coding circuit in which a triple error detection (TEC) function is added to the prior art #1.

In the table, the number of bits of codeword, data, and parity corresponding to m are grouped and displayed in triples.

m is a variable that determines the size of the codeword, and in the prior art #1, the length of the codeword is represented by $2^m-1$.

As shown, when the triple error detection function is added, the length of the parity increases by 1, and as a result, the length of the codeword in the prior art 2 increases to $2^m$.

Conventional BCH coding circuits have a problem in that the circuit area and power consumption increase when the number of parity bits increases.

Also, in the conventional BCH coding circuit, triple error detection capability is limited for the following reasons.

The minimum Hamming distance of a double error correction code is fixed to 5. Accordingly, there exist 5 columns in a parity generator matrix that satisfies a condition that result of an XOR operation of the 5 columns produces a 0 vector.

When the five columns are represented as i, j, k, l, and m, if a triple error occurs at the columns i, j, and k of the codeword, the XOR operation result for the columns i, j, and k becomes the same as a syndrome. This syndrome is an output generated by applying an output codeword to the parity generator matrix.

However, since the XOR operation of the columns l and m and the syndrome must be a 0 vector, the result of the XOR operation on the columns l and m will be the same as the syndrome above, which corresponds to a double error occurring in the l-th and m-th bits.

Accordingly, in the conventional coding circuit, when a triple error occurs, there is a risk of incorrectly determining that a double error has occurred.

SUMMARY

In accordance with an embodiment of the present disclosure, a coding circuit may include an encoder circuit configured to generate input codeword by concatenating an input data and a parity generated by processing the input data using an odd parity generator matrix; and a decoder circuit configured to correct a double error from an output codeword, and to detect a triple error using a syndrome generated by processing the output codeword using the odd parity generator matrix, wherein each column of the odd parity generator matrix has a respective odd number of 1's.

In accordance with an embodiment of the present disclosure, a memory device may include a memory cell array; and a coding circuit configured to provide input codeword to the memory cell array by encoding an input data, and to generate output data and a detection signal by decoding an output codeword output from the memory cell array, wherein the coding circuit includes an encoder circuit configured to generate the input codeword by concatenating the input data and a parity generated by processing the input data using an odd parity generator matrix; and a decoder circuit configured to correct a double error from the output codeword, and to detect a triple error using a syndrome generated by processing the output codeword using the odd parity generator matrix, wherein each column of the odd parity generator matrix has a respective odd number of 1's.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate various embodiments, and explain various principles and advantages of those embodiments.

DETAILED DESCRIPTION

The following detailed description references the accompanying figures in describing illustrative embodiments consistent with this disclosure. The embodiments are provided for illustrative purposes and are not exhaustive. Additional embodiments not explicitly illustrated or described are possible. Further, modifications can be made to presented embodiments within the scope of teachings of the present disclosure. The detailed description is not meant to limit this disclosure. Rather, the scope of the present disclosure is defined in accordance with claims and equivalents thereof. Also, throughout the specification, reference to "an embodiment" or the like is not necessarily to only one embodiment, and different references to any such phrase are not necessarily to the same embodiment(s).

Figure 2:
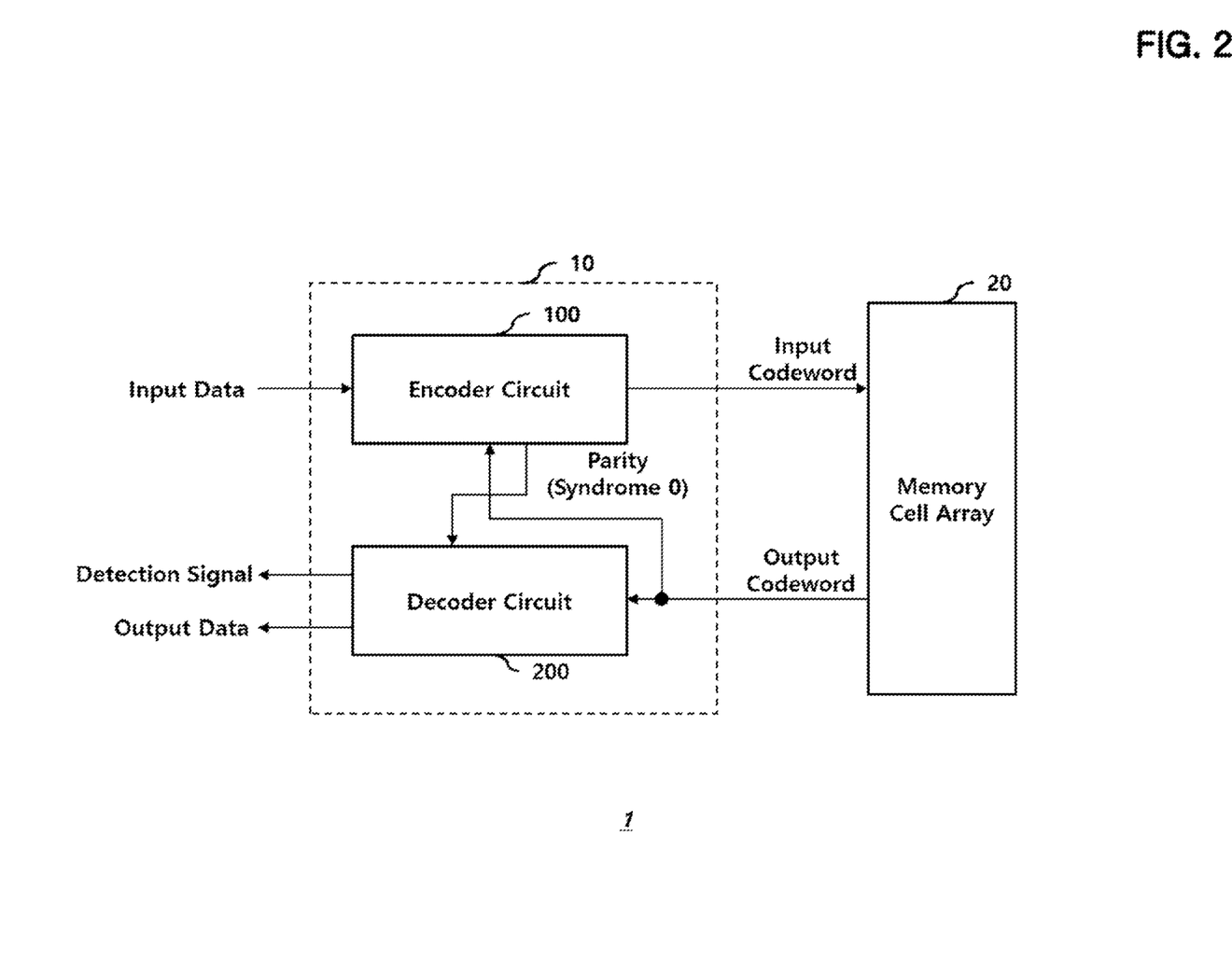
FIG. 2 illustrates a memory device according to an embodiment of the present disclosure.

FIG. 2 is a block diagram illustrating a memory device 1 according to an embodiment of the present disclosure.

The memory device 1 includes a coding circuit 10 and a memory cell array 20.

The memory cell array 20 stores an input codeword generated by the coding circuit 10 during a write operation and provides an output codeword to the coding circuit 10 during a read operation.

The coding circuit 10 includes an encoder circuit 100 that encodes input data to generate the input codeword and a decoder circuit 200 that decodes the output codeword to generate output data and a detection signal.

The decoder circuit 200 provides the output codeword to the encoder circuit 100 and generates a detection signal by referring to a parity (designated Syndrome 0) generated corresponding to the output codeword.

The memory device 1 may further include control circuits necessary for reading or writing data, but since they are not substantially different from the prior art, a repetitive description thereof will be omitted.

Figure 3:
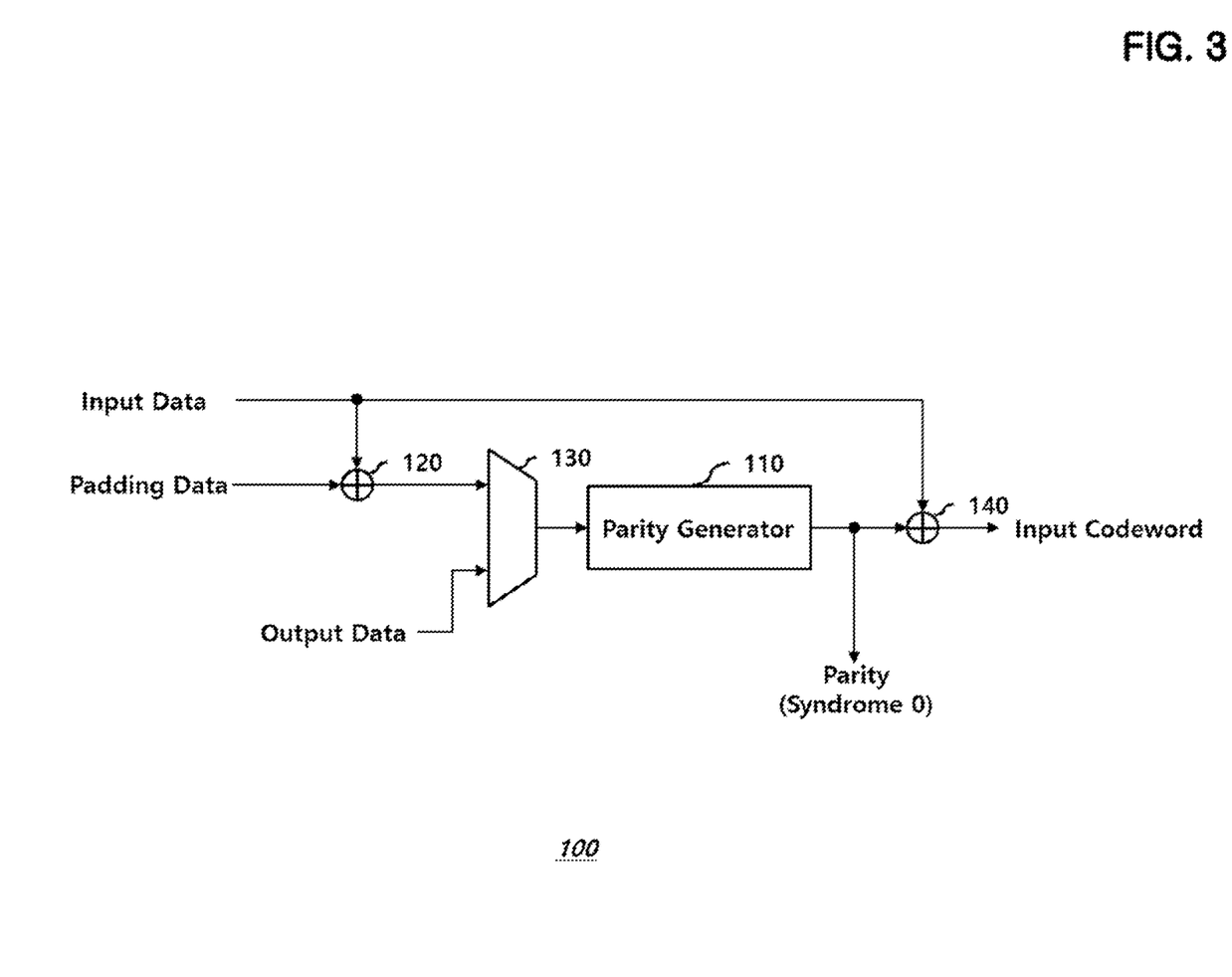
FIG. 3 illustrates an encoder circuit according to an embodiment of the present disclosure.

FIG. 3 is a block diagram showing the encoder circuit 100 according to an embodiment of the present disclosure.

The encoder circuit 100 includes a parity generator 110, a first concatenation circuit 120, a selection circuit 130, and a second concatenation circuit 140.

The parity generator 110 generates the parity by applying the data output from the selection circuit 130 to an odd parity generator matrix.

First, a method for generating an odd parity generator matrix according to the present embodiment is disclosed.

In this embodiment, the coding circuit 10 is a modification of a conventional BCH coding circuit in which the parity bit length is p and the error correction capability is t on the finite field $GF(2^m)$ and the generated codeword has an error detection capability of (t+1). More specifically, the illustrated example corresponds to the case where t is 2.

That is, in the present embodiment, the coding circuit 10 adds a triple error detection function to a conventional BCH coding circuit that performs a double error correction function.

The variable m determines the number of bits of a codeword. In general, the length of a codeword is $2^m-1$, and the number of parity bits p is equal to m times t.

Conventionally, when a triple error detection function is added, the number of parity bits increases by 1 and the length of the entire codeword also increases by 1. In contrast, in the present invention, the number of parity bits is not increased.

When m is given, the corresponding generator function type is determined, and a parity generator matrix is determined from each generator function. Since this is well known in the conventional BCH coding technology, a detailed description thereof will be omitted.

In this embodiment, an odd parity generator matrix is generated by selecting columns having an odd weight from a conventional parity generator matrix, so that all columns of the odd parity generator matrix have respective odd weights. In this case, a column having an odd weight corresponds to a column in which the number of 1's therein is an odd number.

For a given m, a plurality of generator functions may exist, and accordingly, a plurality of parity generator matrices and odd-numbered parity generator matrices corresponding thereto exist.

In this embodiment, it is assumed that when there are a plurality of odd-numbered parity generator matrices, one of those whose number of columns is greater than or equal to the number of bits of the input codeword is selected.

Figure 4A:
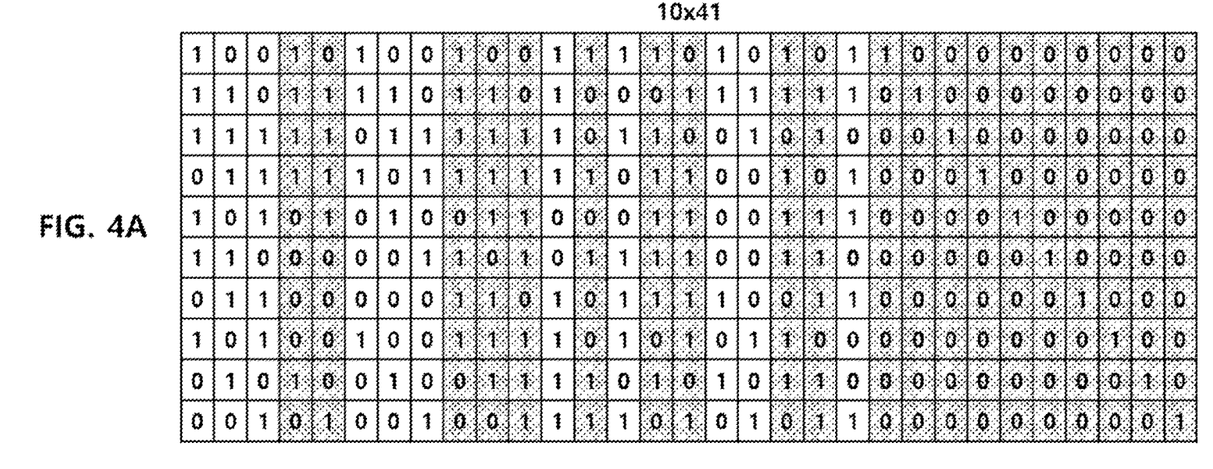
FIGS. 4A and 4B illustrate an operation to generate an odd parity generator matrix according to an embodiment of the present disclosure.
Figure 4B:
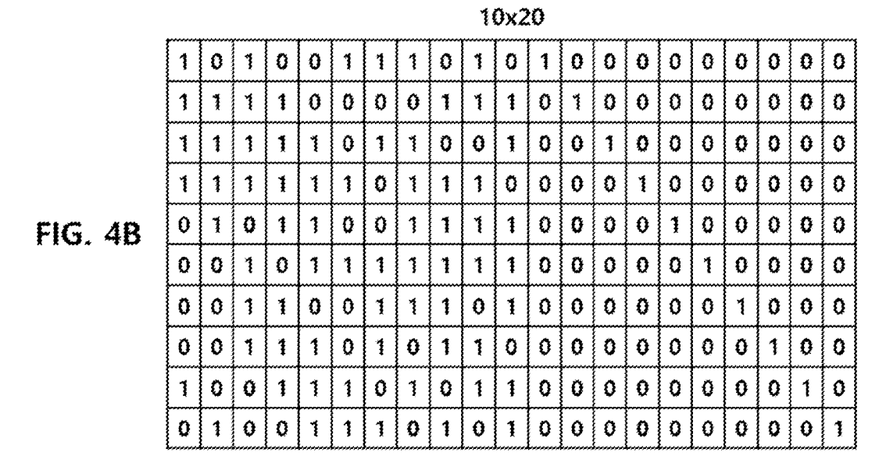

FIGS. 4A and FIG. 4B are diagrams illustrating a method of generating an odd parity generator matrix from a conventional parity generator matrix, where m is 5 as an example.

FIG. 4A represents one of the parity generator matrices corresponding to a case where m is 5 and includes 10 rows and 31 columns.

In this embodiment, an odd parity generator matrix is generated as shown in FIG. 4B by selecting columns having an odd number of 1's therein, that is, columns having an odd weight, from the parity generator matrix of FIG. 4A. The odd parity generator matrix of FIG. 4B generated from FIG. 4A includes 10 rows and 20 columns.

Returning to FIG. 3, the selection circuit 130 selects the output of the first concatenation circuit 120 during a write operation and selects the output codeword during a read operation.

That is, during a write operation, the parity generator 110 generates a first parity corresponding to input data, and during a read operation, the parity generator 110 generates a second parity corresponding to the output data, that is, the output codeword. In this embodiment, the second parity is indicated as Syndrome 0.

The first concatenation circuit 120 concatenates padding data next to the input data. In this embodiment, the padding data includes a plurality of padding bits having respective values of 0, and the number of padding bits is equal to the number of bits of the parity generated by the parity generator 110.

The second concatenation circuit 140 concatenates the input data followed by the parity to generate the input codeword.

A conventional encoder according to a prior art of FIG. 4A, for example, when 21-bit data is input, 31-bit data is generated by concatenating 10-bit padding data and multiplied by the transpose matrix of the parity generator matrix to obtain 10-bit parity. Accordingly, the conventional encoder circuit generates a 31-bit input codeword.

In contrast, when 10-bit input data is input to the encoder circuit 100 according to this embodiment of FIG. 4B, the encoder circuit 100 generates 20-bit data by concatenating the 10-bit input data with 10-bit padding data, and multiplies the concatenated 20-bit data with the transpose matrix of the odd parity generator matrix to generate 10-bit parity. Accordingly, the encoder circuit 100 according to this embodiment generates a 20-bit input codeword.

Figure 5:
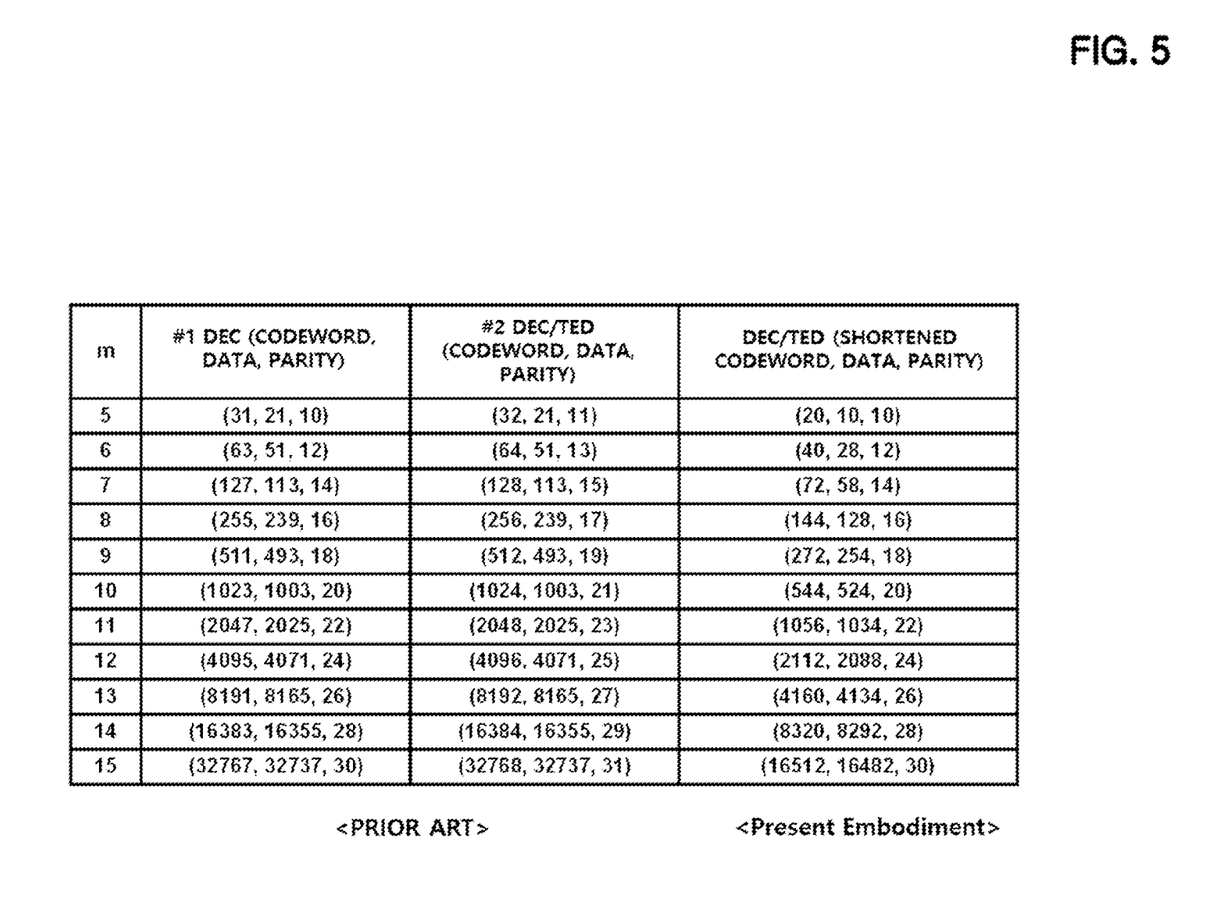
FIG. 5 is a table showing lengths of codewords according to an embodiment of the present disclosure.

FIG. 5 is a table showing a comparison of lengths of codewords according to the prior art and codewords according to the present embodiment.

Prior art #1 corresponds to a conventional BCH coding circuit with double error correction functions, and prior art #2 corresponds to a conventional BCH coding circuit with double error correction and triple error detection functions.

In the table, the number of bits of codeword, data, and parity corresponding to m are grouped and displayed in triples.

For example, encoding 128-bit input data corresponds to a case where m is 8.

The pair corresponding to prior art #1 is (255,239,16) and the pair corresponding to prior art #2 is (26,239,17) (256, 239,17). In contrast, the pair corresponding to this embodiment is (144,128,16).

In order to protect 128-bit data, prior art #2 uses a total of 256-bit codewords including 17-bit parity, but in this embodiment, it is sufficient to use 144-bit codewords including 16-bit parity.

That is, since the required codeword length is reduced while providing the same double error correction and triple error detection functions, the storage space of the memory cell array 20 can be efficiently used when the present technology is applied.

This embodiment is superior in triple error detection performance compared to the prior art #2, and this will be described in detail below.

Figure 6:
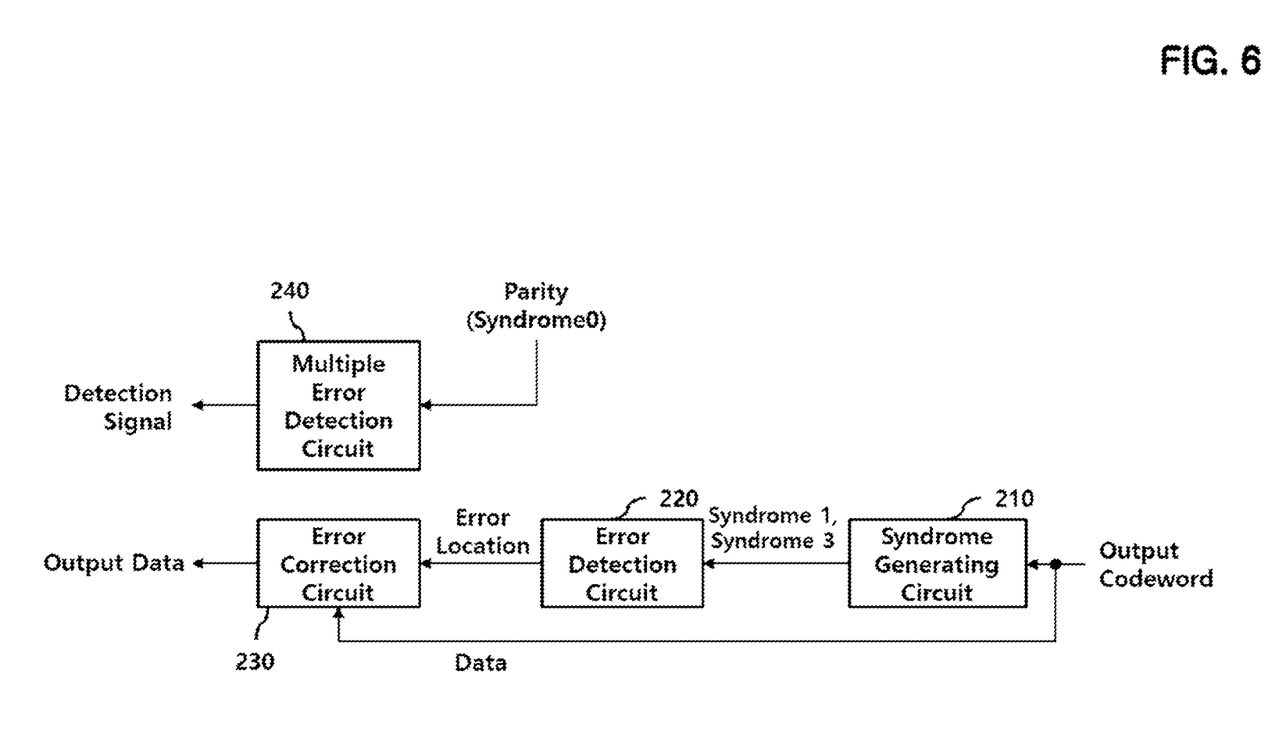
FIG. 6 illustrates a decoder circuit according to an embodiment of the present disclosure.

FIG. 6 is a block diagram showing the decoder circuit 200 according to an embodiment of the present disclosure.

The decoder circuit 200 includes a syndrome generation circuit 210 that generates a plurality of syndromes in the output codeword, an error detection circuit 220 that detects error occurrence positions in the plurality of syndromes including Syndrome 1 and Syndrome 3, and an error correction circuit 230 for correcting data errors at the error occurrence positions and providing output data.

Since the syndrome generation circuit 210, the error detection circuit 220, and the error correction circuit 230 are the same as those included in the conventional BCH decoder circuit having a double error correction function, a detailed description thereof will be omitted.

The decoder circuit 200 according to this embodiment further includes a multiple error detection circuit 240 to perform a triple error detection function.

The multiple error detection circuit 240 generates a detection signal using the parity, which is syndrome 0, output from the encoder circuit 100.

When a triple error exists in the output data, the multiple error detection circuit 240 generates a high level detection signal.

Figure 7:
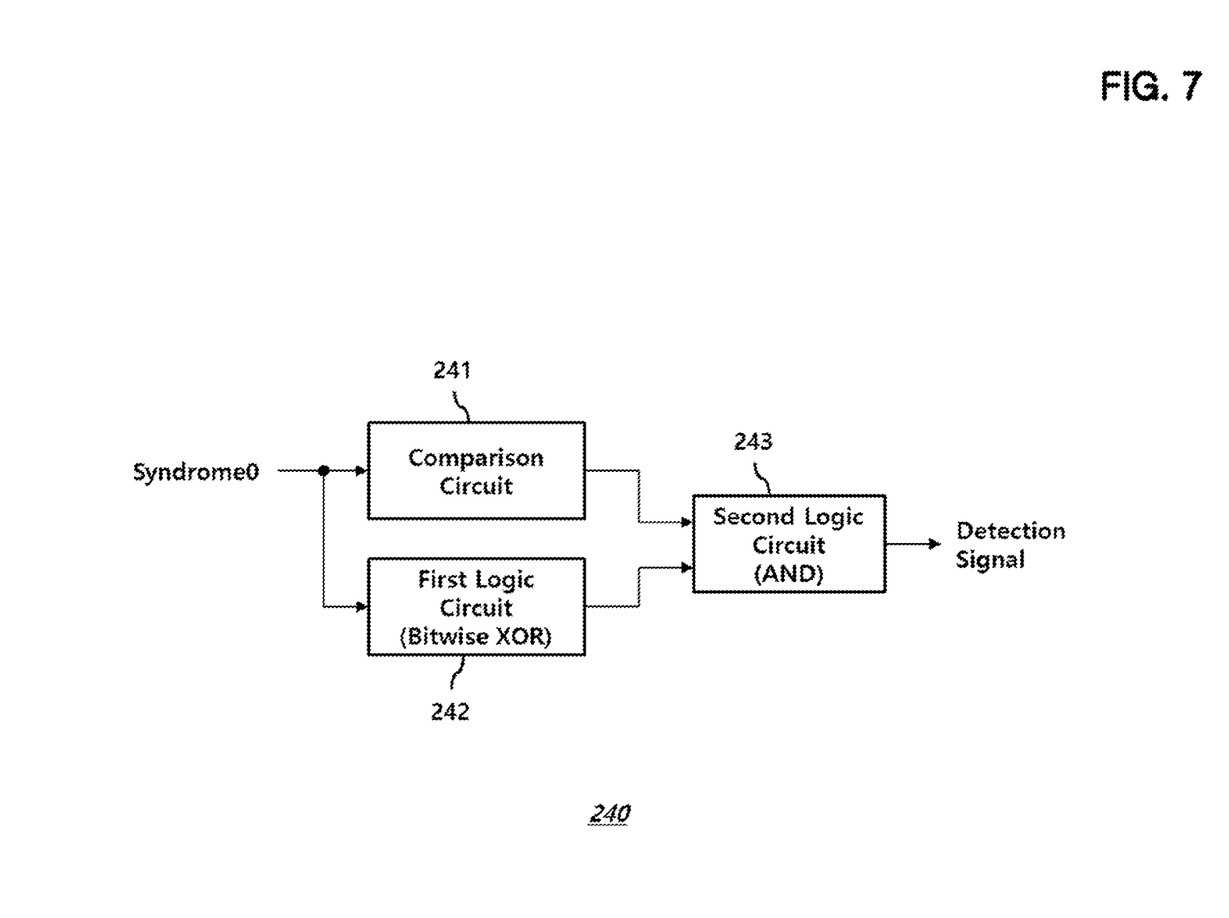
FIG. 7 illustrates a multiple error detection circuit according to an embodiment of the present disclosure.

FIG. 7 is a block diagram showing a multiple error detection circuit 240 according to an embodiment of the present disclosure.

The multiple error detection circuit 240 includes a comparison circuit 241 that compares the Syndrome 0 with an odd parity generator matrix, a first logic circuit 242 that performs an XOR operation on each bit of the Syndrome 0, and a second logic circuit 243 for performing an AND operation on the output of the comparison circuit 241 and the output of the first logic circuit 242.

Comparison circuit 241 compares the Syndrome 0 with each column of the odd parity generator matrix and outputs a low-level signal when a matching column exists and a high-level signal when matching columns do not exist.

That is, a low level signal indicates the presence of a single bit error in the output codeword.

The first logic circuit 242 outputs a high level signal when the number of 1's in the Syndrome 0 is odd, and outputs a low level signal when the number of 1's in the Syndrome 0 is even.

If a triple error occurs, when three columns are selected from the odd parity generator matrix, three columns whose XOR operation result matches the Syndrome 0 can be found. In this case, the XOR operation result which is produced as Syndrome 0 by providing the output data, that is, the output codeword, to the parity generator 110 of the encoder circuit 100 of FIG. 3, has an odd weight.

The Syndrome 0 also has an odd weight when a five or more odd bit error occurs, although the probability of such an error is much lower than the probability of a triple error.

Therefore, syndrome 0 having an odd weight indicates that a triple error has occurred with a high probability.

The second logic circuit 243 generates a detection signal by performing an AND operation on the outputs of the comparator circuit 241 and the first logic circuit 242.

That is, the detection signal has a high-level signal when an odd number of errors occur other than 1-bit error, and has a low-level signal in all the other cases.

In summary, in this embodiment, a high-level detection signal is output when the output codeword includes a triple error, and a high-level detection signal is output even when the output codeword includes a five or more odd number of errors, where the probability of the latter case is lower than that of the former case.

The present embodiment is different from the prior art in that there is no possibility of misdiagnosing the occurrence of a triple error as a double error.

As described above, the minimum Hamming distance of the double error correction code is fixed to 5, and when the XOR operation is performed by selecting 5 columns from the conventional parity generator matrix, there are 5 columns for which the result is a 0 vector.

However, in this embodiment, since the conventional parity generator matrix is changed to an odd parity generator matrix, when the XOR operation is performed by selecting 5 columns, the odd weight becomes an odd weight and the result of the XOR operation does not become a 0 vector, so the same condition as in the prior art does not hold.

When 5 columns are displayed as i, j, k, l, and m, if an error occurs i, j, and k-th bits of the codeword, the XOR operation result for columns i, j, and k is an odd weight and the Syndrome 0 has an odd weight as a result.

In order to misdiagnose a triple error as a double error, there must exist columns l and m, the result of which is the same as the Syndrome 0 when an XOR operation is performed on the two columns l and m. In this case, XOR operation of 5 columns is the same as the XOR operation of the Syndrome 0 and the Syndrome 0, resulting in a 0 vector.

Since result cannot occur in the present embodiment using an odd parity generator matrix, there is no possibility of misdiagnosing a triple error as a double error in the present embodiment.

Although various embodiments have been illustrated and described, various changes and modifications may be made to the described embodiments without departing from the spirit and scope of the invention as defined by the following claims.

What is claimed is:

1. A coding circuit comprising:
    an encoder circuit configured to generate an input codeword by concatenating an input data and a parity generated by processing the input data using an odd parity generator matrix; and
    a decoder circuit configured to correct a double error from an output codeword, and to detect a triple error using a syndrome generated by processing the output codeword using the odd parity generator matrix,
    wherein each column of the odd parity generator matrix has a respective odd number of 1's, and
    wherein the odd parity generator matrix corresponds to a plurality of selected columns selected from a generator matrix corresponding to a predetermined generator function for Bose-Chauduri-Hocquenghem (BCH) coding on a finite field GF ($2^m$), each selected column having a respective odd number of 1's.

2. The coding circuit of claim 1, wherein the encoder circuit includes:
    a first concatenation circuit configured to concatenate the input data and padding data;
    a selection circuit configured to select an output of the first concatenation circuit or the output codeword;

a parity generator configured to process an output of the selection circuit using the odd parity generator matrix; and a second concatenation circuit configured to concatenate the input data and an output of the parity generator to generate the input codeword.

3. The coding circuit of claim 2,
wherein the selection circuit is configured to select the output of the first concatenation circuit during an encoding operation, and select the output codeword during a decoding operation, and
wherein the parity generator generates the syndrome during the decoding operation.

4. The coding circuit of claim 1, wherein the decoder circuit includes:
a syndrome generation circuit configured to generate a plurality of syndromes from the output codeword;
an error detection circuit configured to detect error locations from the plurality of syndromes;
an error correction circuit configured to correct errors of data included in the output codeword according to the error locations and to provide the output data; and
a multiple error detection circuit configured to output a detection signal indicating whether an odd number of bit errors greater than or equal to three is detected using the syndrome.

5. The coding circuit of claim 4, wherein the multiple error detection circuit includes:
a comparison circuit configured to compare the syndrome with the odd parity generator matrix;
a first logic circuit configured to detect number of 1's included in the syndrome; and
a second logic circuit configured to generate the detection signal using an output of the comparison circuit and an output of the first logic circuit.

6. The coding circuit of claim 5,
wherein the comparison circuit outputs a low-level signal when there is no column matching with the syndrome,
wherein the first logic circuit outputs a high-level signal when number of 1's in the syndrome is odd, and
wherein the second logic circuit generates the detection signal by performing a logical AND operation on the output of the comparison circuit and the output of the first logic circuit.

7. A memory device comprising:
a memory cell array; and
a coding circuit configured to provide an input codeword to the memory cell array by encoding input data, and to generate output data and a detection signal by decoding an output codeword output from the memory cell array,
wherein the coding circuit includes:
an encoder circuit configured to generate the input codeword by concatenating the input data and a parity generated by processing the input data using an odd parity generator matrix; and
a decoder circuit configured to correct a double error from the output codeword, and to detect a triple error using a syndrome generated by processing the output codeword using the odd parity generator matrix, wherein each column of the odd parity generator matrix has a respective odd number of 1's, and
wherein the odd parity generator matrix corresponds to a plurality of columns selected from a generator matrix corresponding to a predetermined generator function for Bose-Chauduri-Hocquenghem (BCH) coding on a finite field GF ($2^m$), each selected column having a respective odd number of 1's.

8. The memory device of claim 7, wherein the encoder circuit includes:
a first concatenation circuit configured to concatenate the input data and padding data;
a selection circuit configured to select an output of the first concatenation circuit or the output codeword;
a parity generator configured to process an output of the selection circuit using the odd parity generator matrix; and
a second concatenation circuit configured to concatenate the input data and an output of the parity generator to generate the input codeword.

9. The memory device of claim 8, wherein the selection circuit is configured to select the output of the first concatenation circuit during an encoding operation, and selects the output codeword during a decoding operation, and
wherein the parity generator generates the syndrome during the decoding operation.

10. The memory device of claim 7, wherein the decoder circuit includes:
a syndrome generation circuit configured to generate a plurality of syndromes from the output codeword;
an error detection circuit configured to detect error locations from the plurality of syndromes;
an error correction circuit configured to correct errors of data included in the output codeword according to the error locations and to provide the output data; and
a multiple error detection circuit configured to output a detection signal indicating whether an odd number of bit errors greater than or equal to three is detected using the syndrome.

11. The memory device of claim 10, wherein the multiple error detection circuit includes:
a comparison circuit configured to compare the syndrome with the odd parity generator matrix;
a first logic circuit configured to detect number of 1's included in the syndrome; and
a second logic circuit configured to generate the detection signal using an output of the comparison circuit and an output of the first logic circuit.

12. The memory device of claim 11,
wherein the comparison circuit outputs a low-level signal when there is no column matching with the syndrome,
wherein the first logic circuit outputs a high-level signal when number of 1's in the syndrome is odd, and
wherein the second logic circuit generates the detection signal by performing a logical AND operation on the output of the comparison circuit and the output of the first logic circuit.

* * * * *